(12) United States Patent
Hu

(10) Patent No.: US 9,735,138 B2
(45) Date of Patent: Aug. 15, 2017

(54) INTEGRATED CIRCUIT PACKAGE AND METHOD OF MAKING THE SAME

(71) Applicant: Chih-Liang Hu, Taipei (TW)

(72) Inventor: Chih-Liang Hu, Taipei (TW)

( * ) Notice: Subject to any disclaimer, the term of this patent is extended or adjusted under 35 U.S.C. 154(b) by 0 days.

(21) Appl. No.: 14/921,369

(22) Filed: Oct. 23, 2015

(65) Prior Publication Data

US 2016/0254216 A1    Sep. 1, 2016

(30) Foreign Application Priority Data

Feb. 26, 2015 (TW) .............................. 104106284 A

(51) Int. Cl.
| | |
|---|---|
| *H01L 23/495* | (2006.01) |
| *H01L 25/00* | (2006.01) |
| *H01L 23/00* | (2006.01) |
| *H01L 25/065* | (2006.01) |
| *H01L 23/498* | (2006.01) |

(Continued)

(52) U.S. Cl.
CPC .......... *H01L 25/50* (2013.01); *H01L 21/4832* (2013.01); *H01L 21/4857* (2013.01); *H01L 21/561* (2013.01); *H01L 23/49822* (2013.01); *H01L 24/09* (2013.01); *H01L 24/89* (2013.01); *H01L 24/97* (2013.01); *H01L 25/0655* (2013.01); *H01L 23/3121* (2013.01); *H01L 23/49827* (2013.01); *H01L 2224/0401* (2013.01); *H01L 2224/04042* (2013.01); *H01L 2224/05147* (2013.01); *H01L 2224/08245* (2013.01); *H01L 2224/16245* (2013.01); *H01L 2224/48247* (2013.01); *H01L 2224/80001* (2013.01); *H01L 2224/97* (2013.01); *H01L 2924/14* (2013.01); *H01L 2924/17747* (2013.01)

(58) Field of Classification Search
CPC ............. H01L 21/4814; H01L 21/4832; H01L 21/4846; H01L 21/4857; H01L 21/486; H01L 21/56; H01L 23/3107; H01L 23/3135; H01L 23/49541; H01L 23/49558; H01L 23/49575; H01L 23/49579; H01L 23/49582; H01L 24/00; H01L 24/04; H01L 24/06; H01L 24/07; H01L 24/09; H01L 24/17; H01L 24/19; H01L 24/83; H01L 24/89
See application file for complete search history.

(56) References Cited

U.S. PATENT DOCUMENTS 8,125,074 B2    2/2012  Slavov et al.
8,884,424 B2 *  11/2014 Su ....................... H01L 21/4857
                                                           257/700

(Continued)

*Primary Examiner* — Reema Patel
*Assistant Examiner* — Syed Gheyas
(74) *Attorney, Agent, or Firm* — Hamre, Schumann, Mueller & Larson, P.C.

(57) ABSTRACT

A method of making an integrated circuit package includes: (a) forcing a circuit layered structure that includes a metal substrate and a circuit pattern, the metal substrate having opposite first and second surfaces, the circuit pattern including at least two spaced apart die contacts that protrude from the first surface of the metal substrate, the metal substrate directly interconnecting the die contacts; (b) bonding first and second terminal contacts of an electronic die to the die contacts, respectively; and (c) forming an insulator layer on the first surface of the metal substrate to encapsulate the die and the die contacts after step (b).

3 Claims, 3 Drawing Sheets

(51) Int. Cl.
*H01L 21/48* (2006.01)
*H01L 21/56* (2006.01)
*H01L 23/31* (2006.01)

(56) References Cited

U.S. PATENT DOCUMENTS

| | | | | |
|---|---|---|---|---|
| 2001/0014538 | A1* | 8/2001 | Kwan | H01L 21/4832 |
| | | | | 438/690 |
| 2004/0184219 | A1* | 9/2004 | Otsuka | H01L 23/49805 |
| | | | | 361/306.3 |
| 2012/0001322 | A1* | 1/2012 | Liu | H01L 21/4832 |
| | | | | 257/737 |
| 2012/0025375 | A1* | 2/2012 | Lam | H01L 21/4832 |
| | | | | 257/738 |
| 2013/0140692 | A1* | 6/2013 | Kaneko | H05K 1/111 |
| | | | | 257/737 |
| 2014/0021636 | A1* | 1/2014 | Su | H01L 21/4857 |
| | | | | 257/774 |
| 2014/0299999 | A1* | 10/2014 | Hu | H01L 21/56 |
| | | | | 257/774 |

* cited by examiner

INTEGRATED CIRCUIT PACKAGE AND METHOD OF MAKING THE SAME

CROSS-REFERENCE TO RELATED APPLICATION

This application claims priority of Taiwanese Patent Application No. 104106284, filed on Feb. 26, 2015.

FIELD

The disclosure relates to an integrated circuit package and a method of making the same, more particularly to a method including forming die contacts and an interconnection sub-structure from a metal substrate for making an integrated circuit package.

BACKGROUND

U.S. Pat. No. 8,125,074 discloses a conventional integrated circuit package that includes an integrated circuit die, a plurality of conductive external connection balls, an insulator block, a core layer, a plurality of build-up layers formed between the insulator block and the core layer, and a plurality of circuit connection patterns, each of which is formed between two corresponding ones of the insulator block, the build-up layers and the core layer. The integrated circuit die is embedded in the insulator block, and is electrically connected to the external connection balls through the circuit connection patterns. A side connection pattern, which is distal from the external connection balls, is formed on one side of the build-up layers adjacent to the integrated circuit dies for wire bonding the integrated circuit dies thereto.

The conventional integrated circuit package is disadvantageous in that the thickness thereof is significantly increased due to the presence of the build-up layers and the core layer. In addition, electrical connections among the integrated circuit die and the circuit connection patterns may tend to have defects due to material mismatch and accumulated alignment errors through the formation of the build-up layers and the core layer. In addition, the process of making the conventional integrated circuit package requires formation of vias in the core layer and the build-up layers for forming the interconnection network, which may result in accumulation of the alignment errors and complicate the process. Moreover, since the build-up layers, the circuit connection patterns and the side connection pattern are successively formed on the core layer, a larger tolerance for forming each of the build-up layers, the circuit connection patterns, and the side connection pattern is required in order to accurately align and connect the side circuit pattern and the integrated circuit dies, which results in the requirement of using wire bonding in the process.

SUMMARY

Therefore, an object of the disclosure is to provide a method of making an integrated circuit package that may overcome at least one of the aforesaid drawbacks associated with the prior art.

Another object of the disclosure is to provide an integrated circuit package.

According to one aspect of the disclosure, there is provided a method of making an integrated circuit package. The method includes: (a) forming a circuit layered structure that includes a metal substrate and a circuit pattern, the metal substrate having opposite first and second surfaces, the circuit pattern including at least two spaced apart die contacts that protrude from the first surface of the metal substrate, the metal substrate directly interconnecting the die contacts; (b) bonding first and second terminal contacts of an electronic die to the die contacts, respectively, so as to form an assembly of the electronic die and the circuit layered structure having the metal substrate directly interconnecting the die contacts; and (c) forming an insulator layer on the first surface of the metal substrate of the assembly of the electronic die and the circuit layered structure having the metal substrate directly interconnecting the die contacts to encapsulate the die and the die contacts after step (b).

According to another aspect of the disclosure, there is provided an integrated circuit package that includes: at least one electronic die that has first and second terminal contacts; an interconnection sub-structure that includes a patterned interconnection layer and at least one contact, the interconnection layer having upper and lower surfaces and an interconnecting segment, the contact protruding from the lower surface, the interconnecting segment and the contact being in the form of a single piece; a pair of die contacts that protrude from the upper surface of the interconnection layer and that are stacked on and are directly bonded to the first and second terminal contacts, respectively, the interconnecting segment directly interconnecting the contact and one of the die contacts; and an insulator layer formed on the interconnection layer to encapsulate the electronic die and the die contacts.

BRIEF DESCRIPTION OF THE DRAWINGS

In drawings which illustrate embodiments of the disclosure.

DETAILED DESCRIPTION

Figure 1:
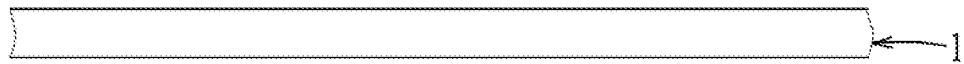
FIGS. 1 to 5 are sectional views illustrating consecutive steps of a method of making the first embodiment of an integrated circuit package according to the disclosure.
Figure 2:
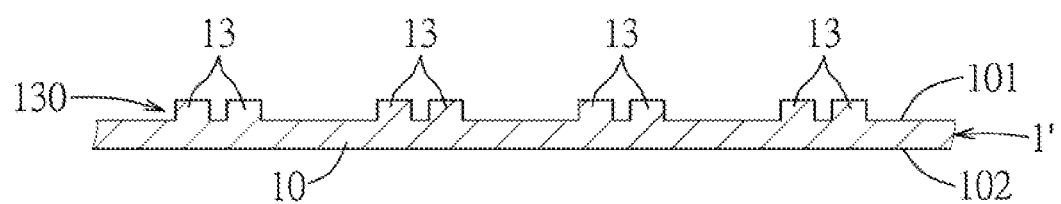
Figure 3:
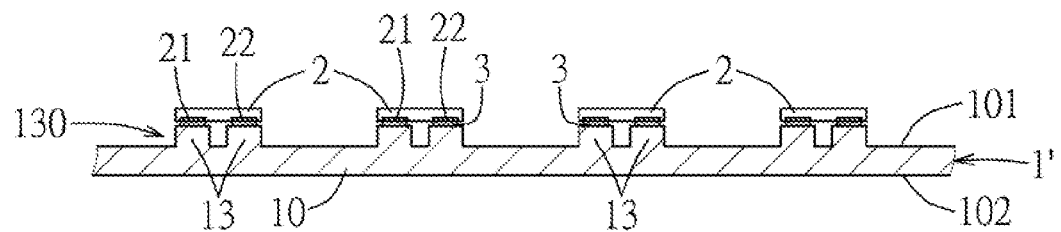
Figure 4:
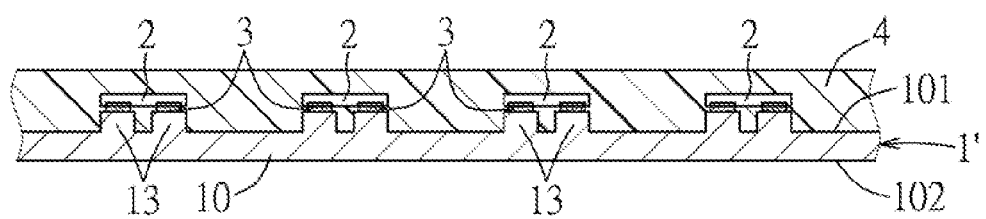

Before the present disclosure is described in greater detail with reference to the accompanying preferred embodiments, it should be noted herein that like elements are denoted by the same reference numerals throughout the disclosure.

Figure 5:
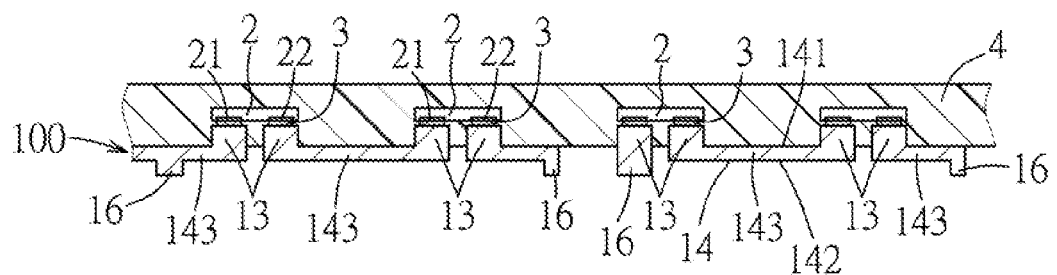

FIG. 5 illustrates the first embodiment of an integrated circuit package according to the disclosure. The integrated circuit package includes a plurality of electronic dies 2, an interconnection sub-structure 100, a plurality of die contacts 13, and a first insulator layer 4.

Each of the electronic dies 2 has first and second terminal contacts 21, 22.

The interconnection sub-structure 100 includes a patterned first interconnection layer 14 and a plurality of first contacts 16. The first interconnection layer 14 has upper and lower surfaces 141, 142 and a plurality of discrete interconnecting segments 143 that are disconnected from one another. The first contacts 16 protrude from the lower surface 142.

The die contacts 13 protrude from the upper surface 141 of the first interconnect ion layer 14, and are coated with a conductive paste 3 or a solder paste thereon. Each pair of the die contacts 13 are aligned with, are stacked on and are directly bonded to the first and second terminal contacts 21, 22 of a corresponding one of the electronic dies 2, respectively, through the conductive paste 3. Alternatively, in certain embodiments, each pair of the die contacts 13 are not aligned with the first and second terminal contacts 21, 22, and are respectively wire bonded to the first and second terminal contacts 21, 22 through bonding wires (not shown) instead of through the conductive paste 3.

Each of the interconnecting segments 143 directly interconnects the corresponding one of the first contacts 16 and a corresponding one of the die contacts 13.

In this embodiment, each of the interconnecting segments 143 and a corresponding one of the first contacts 16, which is connected to the each interconnecting segment 143, are in the form of a single piece. Alternatively, in certain embodiments, each of the interconnecting segments 143, the corresponding one of the first contacts 16 and the corresponding one of the die contacts 13 are in the form of a single piece, and are made from copper.

The first insulator layer 4 is formed on the first interconnection layer 14 to encapsulate the electronic dies 2 and the die contacts 13.

The electronic dies 2 may be diodes, transistors, light emitting diodes, metal-oxide-semiconductor field effect transistors, bipolar junction transistors, or other integrated circuit dies.

The first insulator layer 4 may be made from epoxy or polyimide.

FIGS. 1 to 5 illustrate consecutive steps of a method of making the first embodiment of the integrated circuit package. The method includes: preparing a metal plate 1 (see FIG. 1); etching the metal plate 1 using etching techniques so as to form a circuit layered structure 1' (see FIG. 2) that includes a metal substrate 10 and a circuit pattern 130, the metal substrate 10 having opposite first and second surfaces 101, 102, the circuit pattern 130 including a plurality of spaced apart die contacts 13 that protrude from the first surface 101 of the metal substrate 10, the metal substrate 10 directly interconnecting the die contacts 13; preparing a plurality of electronic dies 2, each of which has first and second terminal contacts 21, 22 (see FIG. 3); bonding the first and second terminal contacts 21, 22 of each of the electronic dies 2 to a corresponding pair of the die contacts 13, respectively, through a conductive paste 3 (see FIG. 3), so as to form an assembly of each electronic die 2 and the circuit layered structure 1' having the metal substrate 10 directly interconnecting the die contacts 13; forming a first insulator layer 4 on the first surface 101 of the metal substrate 10 of the assembly of each electronic die 2 and the circuit layered structure 1' having the metal substrate 10 directly interconnecting the die contacts 13 to encapsulate the dies 2 and the die contacts 13 (see FIG. 4); and etching the metal substrate 10 from the second surface 102 of the metal substrate 10 toward the first surface 101 of the metal substrate 10 so as to form the metal substrate 10 into the aforementioned interconnection sub-structure 100 (see FIG. 5). The metal substrate 10 is etched in such a manner that each pair of the die contacts 13, which are bonded to the first and second terminal contacts 21, 22 of the corresponding one of the electronic dies 2, are no longer connected to each other through the metal substrate 10, i.e., after etching they are not physically connected to each other through the first interconnection layer 14 of the interconnection sub-structure 100.

Alternatively, in certain embodiments, the circuit layered structure 1' may be formed by depositing die contacts 13 on a metal substrate 10 using deposition techniques (not shown).

Figure 10:
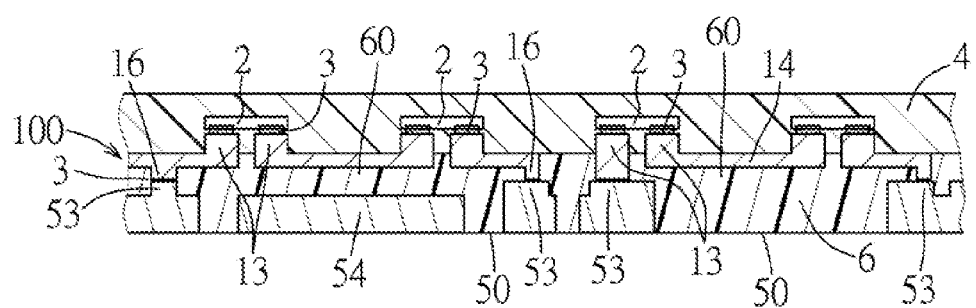

FIG. 10 illustrates the second embodiment of the integrated circuit package according to the disclosure. The second embodiment differs from the previous embodiment in that the second embodiment further includes a patterned second interconnection layer 54, a plurality of second contacts 53, and a second insulator layer 6.

The second contacts 53 protrude from the second interconnection layer 54, and are bonded to the first contacts 16, respectively, through the conductive paste 3. The second interconnection layer 54 is formed with at least one through-hole 50, and cooperates with the first interconnection layer 14 to define an inner space 60 therebetween. The second insulator layer 6 fills the through-holes 50 and the inner space 60.

Figure 6:
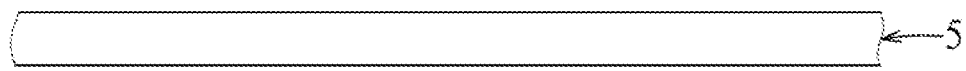
FIGS. 6 to 10, in combination with FIGS. 1 to 5, are sectional views illustrating consecutive steps of a method of making the second embodiment of an integrated circuit package according to the disclosure.
Figure 7:
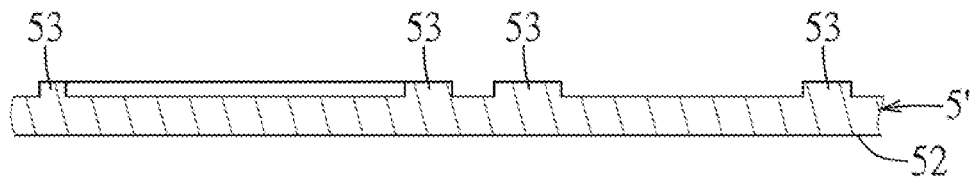
Figure 8:
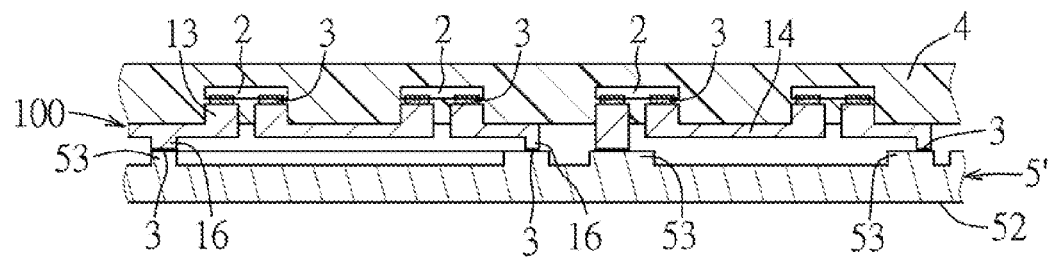
Figure 9:
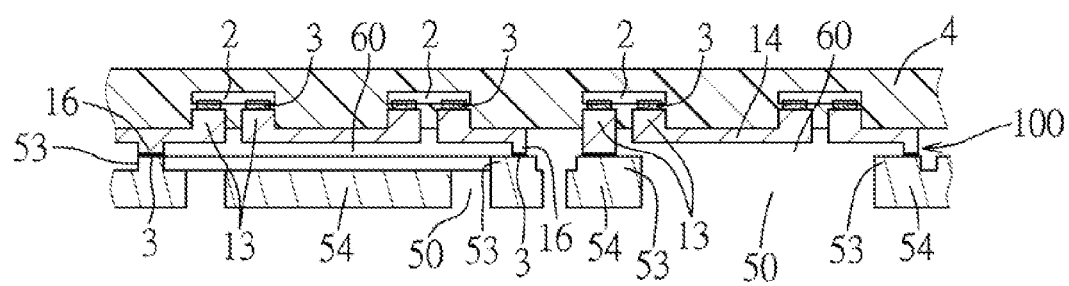

The method of making the second embodiment of the integrated circuit package differs from the method of making the previous embodiment in that the method further includes: preparing a second metal plate 5 (see FIG. 6); etching the second metal plate 5 so as to form an interconnection layered structure 5' (see FIG. 7) that includes an interconnection substrate 52 and a plurality of second contacts 53 protruding from the interconnection substrate 52; bonding each of the second contacts 53 to a corresponding one of the first contacts 16 through the conductive paste 3 (see FIG. 8); etching the interconnection substrate 52 so as to form the interconnection substrate 52 into the patterned second interconnection layer 54 which is formed with at least one through-hole 50 to expose a portion of the first interconnection layer 14 and a portion of the first insulator layer 4 (see FIG. 9); and forming a second insulator layer 6 that fills the through-hole 50 in the second interconnection layer 54 and an inner space 60 between the first and second interconnection layers 14, 54 and that covers the exposed portion of the first interconnection layer 14 and the exposed portion of the first insulator layer 4 (see FIG. 10).

In the conventional method, it is relatively difficult to accurately align the integrated circuit dies with the side connection pattern, which is to be wire bonded to the integrated circuit dies, due to the alignment errors resulting from the successive forming of the build-up layers and the circuit connection patterns. In contrast, in the method of the present disclosure, the electronic dies 2 can be directly and accurately attached to the die contacts 13 of the circuit layered structure 1' through the conductive paste 3 or can be accurately wire bonded to the die contacts 13 of the circuit layered structure 1' through bonding wires since the attachment or wire bonding is conducted after the formation of the die contacts 13 and before the formation of the subsequent connections, such as the first and second interconnection layers 14, 54 and the first and second contacts 16, 53. Moreover, the connections of the present disclosure, such as the first interconnection layer 14, the first contacts 16 and the die contacts 13 may be made from a single metal plate by etching techniques, which may alleviate at least one of the aforesaid drawbacks associated with the prior are.

While the disclosure has been described in connection with what are considered the exemplary embodiments, it is understood that the disclosure is not limited to the disclosed embodiments but is intended to cover various arrangements included within the spirit and scope of the broadest interpretation and equivalent arrangements.

What is claimed is:

1. A method of making an integrated circuit package having first and second metal plates, comprising:
   (a) forming a circuit layered structure out of the first metal plate that includes a metal substrate and a circuit pattern, the metal substrate having opposite first and second surfaces, the circuit pattern including at least two spaced apart die contacts that protrude from the first surface of the metal substrate, the metal substrate directly interconnecting the die contacts;

(b) bonding first and second terminal contacts of an electronic die to the die contacts, respectively, so as to form an assembly of the electronic die and the circuit layered structure having the metal substrate directly interconnecting the die contacts;

(c) forming a first insulator layer on the first surface of the metal substrate of the assembly of the electronic die and the circuit layered structure to encapsulate the die and the die contacts;

(d) etching the metal substrate from the second surface to form an interconnection sub-structure that includes a patterned first interconnection layer and at least one first contact; where the first interconnection layer having upper and lower surfaces and an interconnecting segment, the first contact protruding from the lower surface of the first interconnection layer, the die contacts protruding from the upper surface of the first interconnection layer, the interconnecting segment directly interconnecting the first contact and one of the die contacts, and the die contacts are not physically connected to each other through the interconnection sub-structure;

(e) forming an interconnection layered structure out of the second metal plate that includes an interconnection substrate and at least one second contact protruding from the interconnection substrate and then bonding the second contact to the first contact;

(f) etching the interconnection substrate so as to form the interconnection substrate into a patterned second interconnection layer which is formed with at least one through-hole to expose a portion of the first interconnection layer and a portion of the first insulator layer; and (g) forming a second insulator layer that fills the through-hole in the second interconnection layer and an inner space between the first and second interconnection layers.

2. The method of claim 1, wherein the circuit layered structure is formed by etching a metal plate using etching techniques.

3. The method of claim 1, wherein the circuit layered structure is formed by depositing the die contacts on the metal substrate using deposition techniques.

* * * * *